United States Patent
Lovett

(10) Patent No.: US 7,307,901 B2
(45) Date of Patent: Dec. 11, 2007

(54) APPARATUS AND METHOD FOR IMPROVING DYNAMIC REFRESH IN A MEMORY DEVICE

(75) Inventor: Simon J. Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/644,642

(22) Filed: Dec. 22, 2006

(65) Prior Publication Data

US 2007/0104018 A1  May 10, 2007

Related U.S. Application Data

(63) Continuation of application No. 10/873,968, filed on Jun. 22, 2004, now Pat. No. 7,167,400.

(51) Int. Cl.
*G11C 7/00* (2006.01)

(52) U.S. Cl. .................................. 365/194; 365/233.5

(58) Field of Classification Search ............... 365/194, 365/233.5; 327/552
See application file for complete search history.

(56) References Cited

U.S. PATENT DOCUMENTS

| | | | |
|---|---|---|---|
| 4,736,344 A | 4/1988 | Yanagisawa | |
| 4,800,304 A * | 1/1989 | Takeuchi | 327/279 |
| 4,809,233 A | 2/1989 | Takemae | |
| 6,426,908 B1 | 7/2002 | Hidaka | |
| 6,445,637 B2 | 9/2002 | Nanba | |
| 6,542,426 B2 | 4/2003 | Jung et al. | |
| 6,577,550 B2 | 6/2003 | Ito | |
| 6,751,144 B2 | 6/2004 | Takahashi et al. | |
| 6,850,449 B2 | 2/2005 | Takahashi | |
| 6,873,568 B2 | 3/2005 | Demone | |
| 6,903,590 B2 * | 6/2005 | Indoh | 327/172 |
| 6,972,606 B2 * | 12/2005 | Ku et al. | 327/284 |
| 2004/0212408 A1 * | 10/2004 | Indoh | 327/143 |
| 2005/0030079 A1 * | 2/2005 | Ku et al. | 327/263 |

\* cited by examiner

*Primary Examiner*—Michael T Tran
(74) *Attorney, Agent, or Firm*—Jones Day; Edward L. Pencoske

(57) ABSTRACT

An apparatus and method for generating a control pulse for closing an active wordline in a memory device is provided. A timeout generator circuit having a time delay portion and a reset portion may be used to generate a close signal. The time delay portion may define a predetermined time delay interval. The timeout generator may be used in combination with an address transition detector in a refresh controller for a memory device. A method is given in which a control pulse is generated in response to an active mode signal, a timer measuring a predetermined time delay interval is activated in response to the control pulse, a close signal is produced in response to the expiration of the predetermined time delay interval, and the active wordline is closed in response to the close signal.

20 Claims, 9 Drawing Sheets

APPARATUS AND METHOD FOR IMPROVING DYNAMIC REFRESH IN A MEMORY DEVICE

CROSS REFERENCE TO RELATED APPLICATIONS

The present application is a continuation of U.S. application Ser. No. 10/873,968 filed Jun. 22, 2004, now U.S. Pat. No. 7,167,400 and entitled Apparatus and Method for Improving Dynamic Refresh in a Memory Device.

BACKGROUND OF THE INVENTION

The present invention relates generally to reducing the amount of power consumed by an integrated circuit and more particularly to reducing the standby power consumed by a dynamic random access memory (DRAM).

A typical DRAM memory device is comprised of a plurality of memory cells, each comprised of a transistor and a capacitor. Each memory cell stores one bit of data in the form of a voltage. A high voltage level (e.g., 3V) represents a logic "1", whereas a low voltage level (e.g., 0V) represents a logic "0". The memory cells may be arranged in an array with each memory cell being connected to a wordline and a digitline. The DRAM may also include peripheral devices, such as drivers, sense amps, input/output devices, and power supplies, etc., that are used to identify memory cells, access the memory cells, and store information within and read information from the memory cells, among others.

One characteristic associated with DRAMs is that the voltage stored on the capacitors of the individual cells tend to dissipate over time as a result of leakage currents. Thus, the cells of the DRAM must be periodically refreshed to ensure the integrity of the data stored therein. A refresh operation generally comprises sensing the data held in certain of the memory cells and then restoring the data from the sense amplifiers back to full CMOS logic levels in the memory cells. The maximum amount of time that may pass before a refresh operation must be completed (i.e., before the memory cells lose their stored charge) is referred to as the refresh rate. Due to their structure, DRAM's may have multiple refresh rates depending of their mode of operation. For example, a DRAM operating in the standby mode (e.g., when the digitlines are equalized and precharged to Vcc/2 and the wordlines are off) may have one refresh rate, referred to as a "static refresh rate," whereas the same DRAM operating in the active mode (e.g., when the sense amps are active and the digitlines are forced to CMOS logic levels (Vcc and GND)) may have another refresh rate, referred to as a "dynamic refresh rate."

The amount of stand-by power or "self-refresh" current used by the DRAM is dependent upon the refresh rate. Stand-by power and self-refresh current can be reduced by refreshing at the DRAM's slowest possible refresh rate. For example, a pseudo-static random access memory (PSRAM) may have a static refresh rate of approximately 1000 mS (i.e., the cells need refreshing every 1000 mS), and a dynamic refresh rate of approximately 100 mS (i.e., cells need refreshing every 100 mS). Refreshing the PSRAM every 1000 mS (i.e., at the static refresh rate), as compared to refreshing the PSRAM every 100 mS (i.e., the dynamic refresh rate), will consume less stand-by power and self-refresh current because the refresh operations are executed less often. However, since the DRAM memory array must operate both in standby and active modes, the faster dynamic refresh rate sets the overall refresh rate of the device. Thus, the refresh rate is set at the worst case condition (here, the 100 mS refresh rate) to insure the integrity of the stored data.

Thus, there exists a need for an apparatus and method for taking advantage of the longer available refresh rate, thereby reducing current flow in a memory device during the standby mode and overcoming other limitations inherent in prior art.

SUMMARY OF THE INVENTION

One aspect of the invention relates to a timeout generator circuit having a time delay portion and a reset portion. The time delay portion may define a predetermined time delay interval. The timeout generator circuit is operable to produce a "close" signal for closing an active wordline in a memory device. The timeout generator may be used in combination with an address transition detector in control logic for a memory device.

Another aspect of the invention relates to a method for closing an active wordline in a memory array. The method comprises generating a control pulse in response to an active mode signal, activating a timer measuring a predetermined time delay interval in response to the control pulse, producing a close signal in response to the expiration of the predetermined time delay interval, and closing the active wordline in response to the close signal.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION OF THE INVENTION

Figure 1:
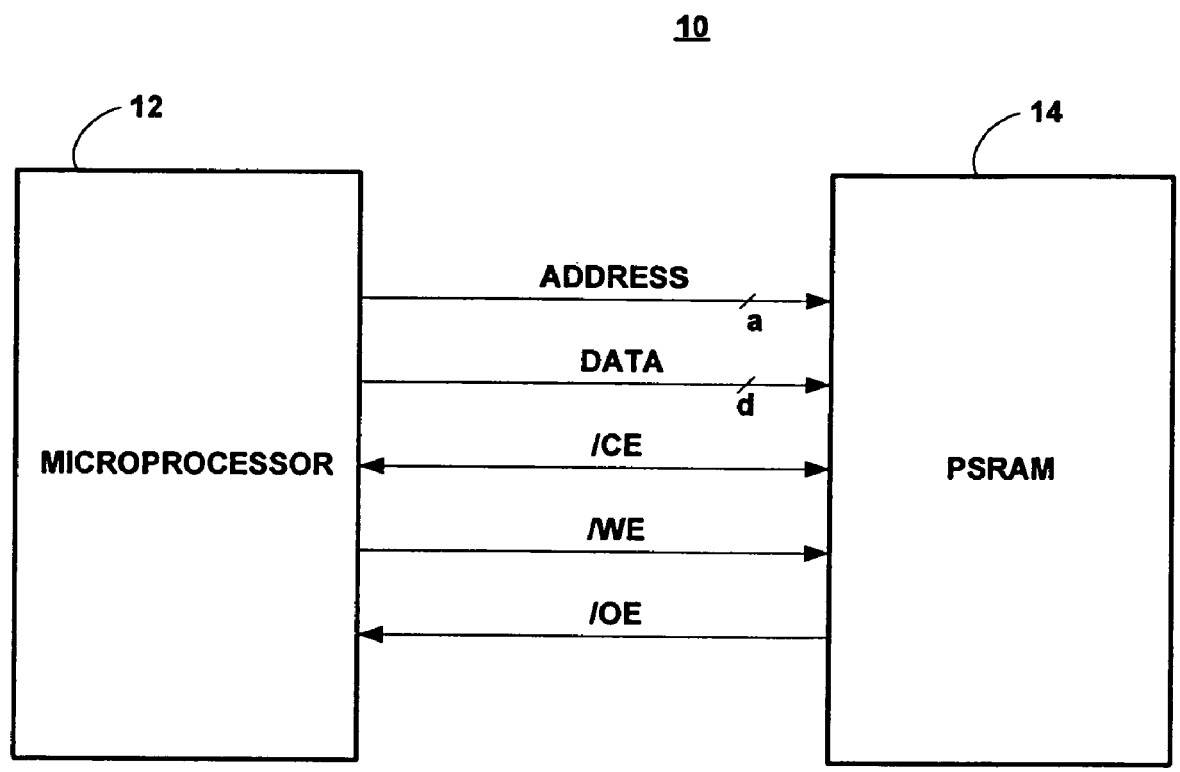
FIG. 1 illustrates a block diagram of a system using a pseudo-static random access memory (PSRAM) according one embodiment.

FIG. 1 illustrates a block diagram of a system 10 comprised of a microprocessor, micro-controller, ASIC, etc. 12 in communication with a pseudo-static random access memory (PSRAM) 14. It should be apparent to those skilled in the art that other types of dynamic random access memory (DRAM) may be used while remaining within the scope of the invention. Various signals are shared between the processor 12 and the PSRAM 14. For example, ADDRESS, DATA, /CE, /WE, and /OE signals (as are known in the art) are illustrated in FIG. 1. It should be apparent to one skilled in the art that the illustrated signals are for exemplary purposes only and not intended to limit the present invention.

Figure 2:
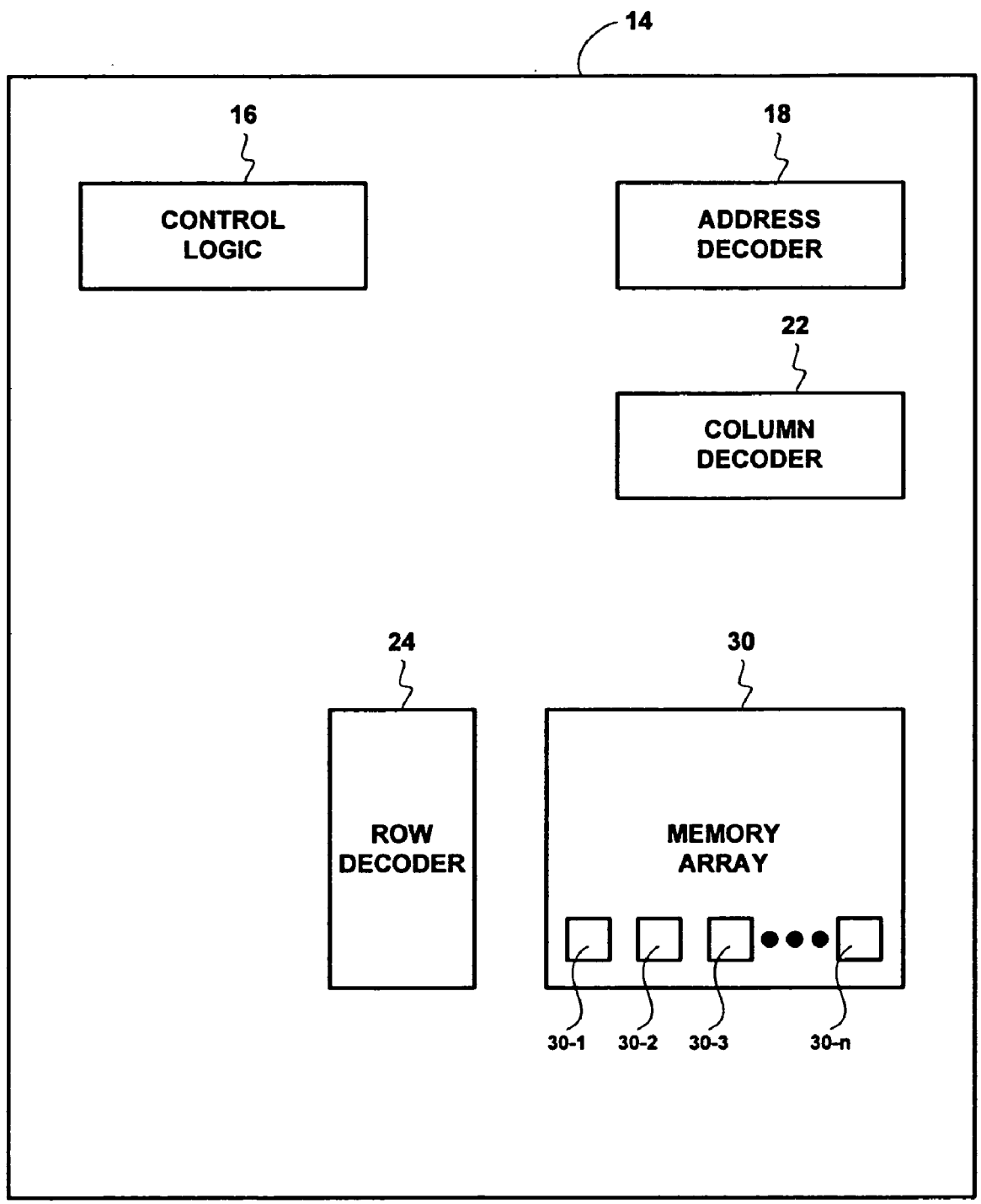
FIG. 2 illustrates a block diagram of the PSRAM of FIG. 1 according to one embodiment.

Turning to FIG. 2, a block diagram of the PSRAM 14 is illustrated. The PSRAM 14 is comprised of a main memory array 30 and other support circuitry. The main memory array 30 may be further divided into a number of sub-arrays (i.e., 30-1, 30-2, 30-3, ... 30-n). Those of ordinary skill in the art will recognize that support circuitry may include control logic 16, an address decoder 18, a column decoder 22, and a row decoder 24, among other components for writing information into and reading information out from main memory array 30. Additionally, those of ordinary skill in the art will recognize that other support circuits may be included which are not disclosed in detail as they do not form a feature of the present invention.

Figure 3:
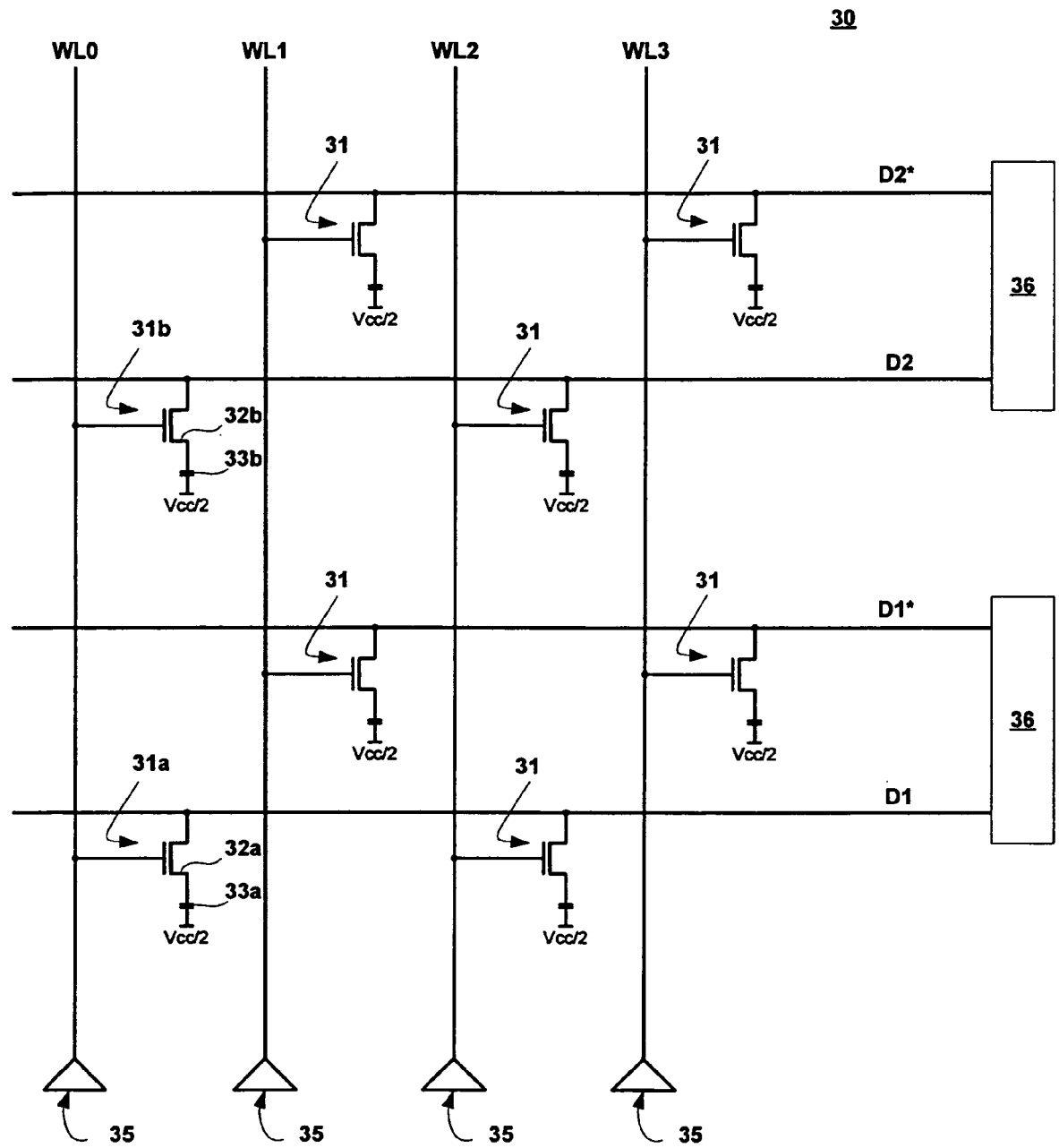
FIG. 3 is a simplified schematic of a portion of the PSRAM array of FIG. 2.

FIG. 3 is a simplified schematic of the memory array 30 of FIG. 2. The memory array 30, as illustrated, may be referred to as an open digitline array, however, it should be apparent to those skilled in the art that other DRAM architectures (for example, a folded digitline DRAM memory array) may be used while remaining within the scope of the present invention.

The array 30 is comprised of a plurality of memory cells or memory bits (mbit) 31, each of which includes a mbit transistor 32 and a storage capacitor 33. The mbits 31 are capable of holding binary information in the form of stored charge on their capacitors 33. The mbit transistors 32 operate as a switch interposed between the mbit capacitors 33 and their associated digitlines (e.g., D1, D1*, D2, D2*). The mbit transistors 32 are operated (i.e., activated/deactivated) using signals supplied on an associated wordline (e.g., WL0, WL1, WL2, WL3) via wordline drivers 35.

Accessing an mbit 31 results in charge sharing between the accessed mbit capacitor 33 and its corresponding digitline (e.g., D1, D1*, D2, D2*). If the accessed mbit capacitor 33 contains a stored logic one (e.g., Vcc), the charge between the capacitor and the digitline causes the voltage on the corresponding digitline (e.g., D1, D1*, D2, D2*) to increase. If the accessed mbit capacitor 33 contains a stored logic zero (e.g., 0V), the charge sharing causes the voltage on the corresponding digitline (e.g., D1, D1*, D2, D2*) to decrease. This is true because the digitlines are precharged to Vcc/2 prior to the array access operation. The digitlines (e.g., D1, D1*, D2, D2*) are connected to peripheral devices 36 which are used, for example, to determine whether the charge stored in the accessed mbit 31 was a logic one or a logic zero. It should be apparent to one skilled in the art that the size of the array 30 illustrated in FIG. 1 (i.e., with eight mbits 31, four wordlines WL0, WL1, WL2, WL3, and two digitline pairs D1-D1*, D2-D2*) is used for exemplary purposes and that arrays having a different size and layout are within the scope of the present invention.

In FIG. 3, assume that mbit 31a (i.e., the mbit located at the intersection digitline D1 and wordline WL0) is being accessed in a read operation. First, the digitlines D1, D1* are precharged to a predetermined voltage level (e.g., Vcc/2) by connecting the digitlines D1, D1* to a voltage source (for example, using an equalization device (not shown) to connect the digitlines D1, D1* to voltage source Vcc/2). The digitlines D1, D1* are then isolated from the voltage source (for example, using isolation device (not shown)), however due to inherent capacitance, the digitlines D1, D1* float at the Vcc/2 voltage level. The associated wordline driver 35 then drives wordline WL0 to a voltage that is at least one transistor threshold voltage (Vth) above Vcc. This voltage level may be referred as Vccp or Vpp. This voltage activates mbit transistor 32a and allows charge sharing between mbit capacitor 33a and digitline D1.

If the mbit capacitor 33a contains a stored logic one (e.g., Vcc), the charge sharing causes the voltage on digitline D1 to increase. If the mbit capacitor 33a contains a stored logic zero (e.g., 0V), the charge sharing causes the voltage on digitline D1 to decrease. It should be noted that digitline D1* remains substantially at the precharge level Vcc/2 (the voltage of digitline D1* may change slightly due to parasitic coupling with, for example, D1 and WL0). The differential voltage between the digitlines D1, D1* is read by a peripheral device 36 (for example, a sense amplifier (not shown)). Sensing generally refers to the amplification of the differential voltage (i.e., the digitline signal) between a pair of digitlines (e.g., D1-D1*, D2-D2*).

The activated wordline (here WL0) may remain activated until the other mbits 31 on the active wordline are read. For example, a "burst read" may be completed wherein each mbit 31 having its mbit transistor 32 gated by WL0 (e.g., mbit 31a, mbit 31b, etc.) is simultaneously read by the peripheral devices 36 located on each mbit's associated digitlines (e.g., D1-D1* for mbit 31a, D2-D2* form bit 31b). Typically, a wordline remains activated until a signal to activate another wordline (e.g., WL1, WL2, WL3, etc.) is received or until the array 30 enters into standby mode.

When the complementary digitline pairs D1-D1*, etc. are at CMOS levels (e.g., when sense amplifier 36 is activated), mbit transistor 32a has a full drain-to-source voltage Vds across its terminals (i.e., Vds=Vcc−0V), as do all of the other mbit transistors 32 within the mbit cells 31 attached to the same digitline pair. These non-accessed mbit cells 31 are inclined to lose their stored charge at an accelerated rate under these bias conditions since drain-to-source leakage current is proportional to Vds. Thus, the refresh rate for the memory array 30 must remain at it's worst case refresh rate. The PSRAM discussed above, for example, must be refreshed at its dynamic refresh rate of 100 mS.

Figure 4:
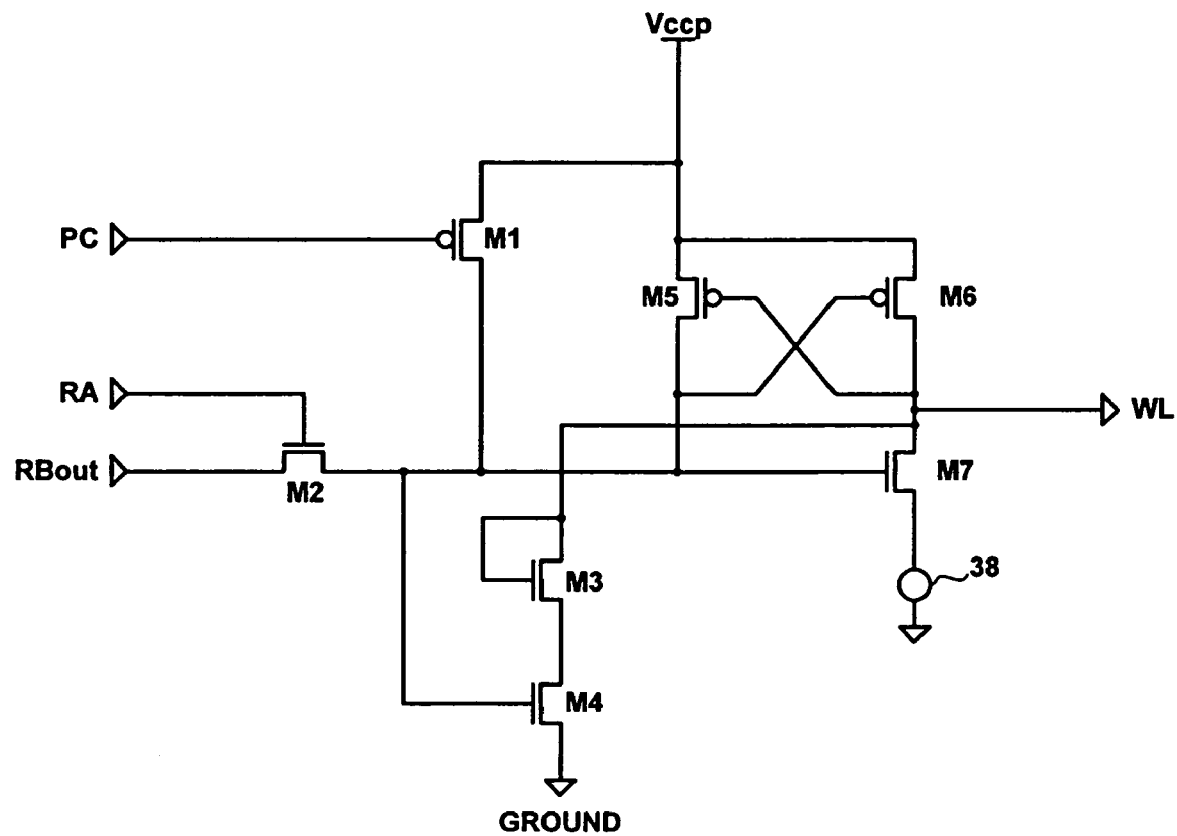
FIG. 4 is a schematic of a wordline driver according to the prior art.

FIG. 4 is a circuit schematic for a typical wordline driver. The circuit schematic illustrated in FIG. 4 may be referred to as a CMOS driver. It should be apparent to those skilled in the art that other types of wordline drivers may be used while remaining within the scope of the present invention. A precharge (PC) signal and address signals (RA and RBout), among others, may be used to control the wordline driver. Generally when the wordline driver is in the active mode, M6 is conductive, M7 is nonconductive, and the wordline WL is driven to Vccp. In contrast, when the wordline driver is in the standby mode, M7 is conductive, M6 is nonconductive, and the wordline WL is driven to NEGWL (or some other potential such as 0V) by negative wordline voltage generator 38. As discussed above, the activated wordline typically remains activated until a signal to activate another wordline (e.g., WL1, WL2, WL3, etc.) is received or until the array 30 enters into standby mode.

Figure 5:
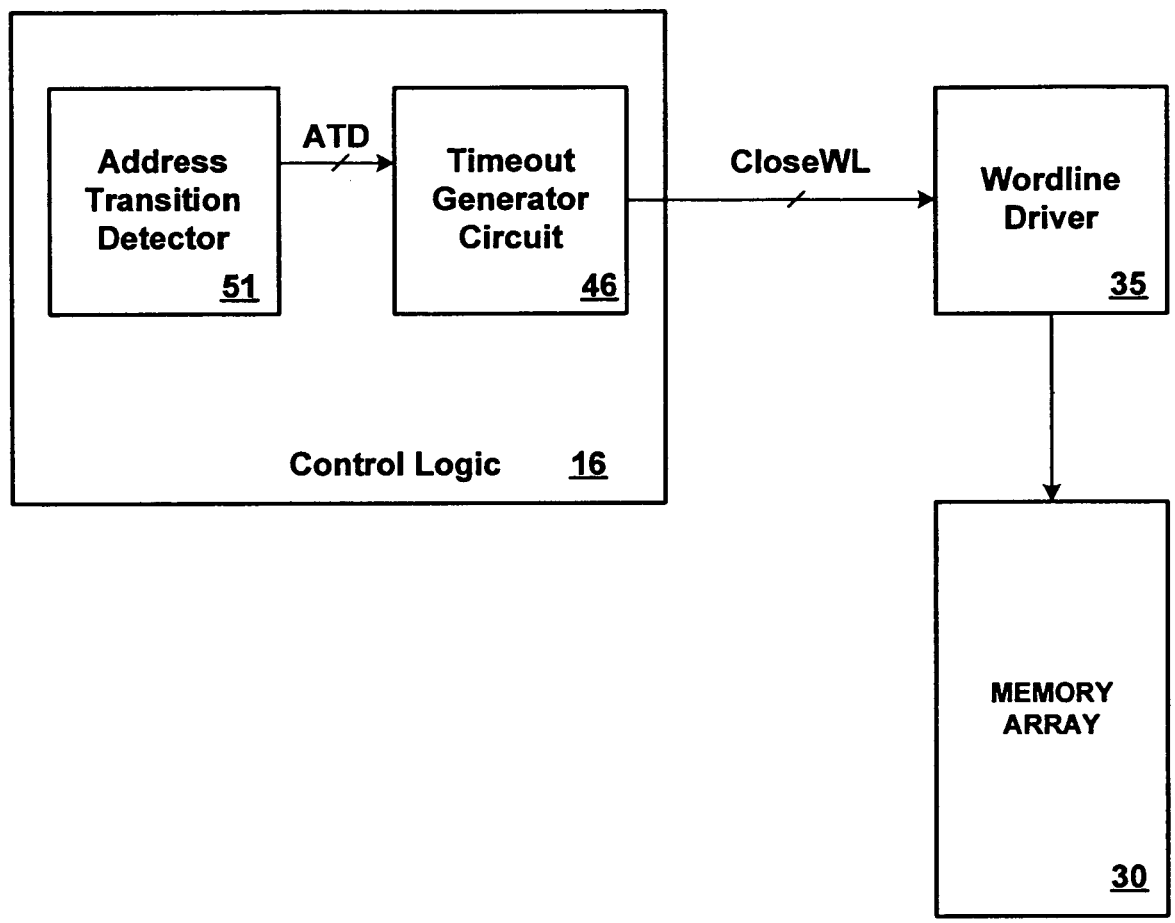
FIG. 5 is a block diagram illustrating a portion of the PSRAM 14 of FIG. 2 according to one embodiment.

FIG. 5 is a block diagram illustrating a portion of the PSRAM 14 which incorporates a control logic 16 according to one embodiment. The control logic 16 includes an address transition detector circuit 51 and a timeout generator circuit 46, among others. The address transition detector circuit 51 produces an address transition detection pulse (ATD) each time that an active mode signal is received by (and/or produced by) the memory array 30. An active mode signal refers to a signal that is issued to place the memory array 30 into the active mode and/or that is issued while the memory array 30 is in the active mode. An active mode signal may include, for example, address signals and/or control signals that are applied to the memory device pins indicating that a read and/or write operation is being requested. The ATD pulse is input into the timeout generator circuit 46 which produces a close-wordline (CloseWL) control signal. The CloseWL control signal is a output to one or more wordline drivers 35, which drive the array's 30 wordlines (WL0, WL1, WL2, WL3) as discussed above in conjunction with FIG. 3.

In one embodiment, the control logic 16 generally functions as follows: once an ATD pulse is generated (for example, when a wordline "active" command is received for a read or write operation request), the timeout generator circuit 46 begins a timer. If no new read or write command is received within a predefined time interval (for example, 10 μS) set by the timer, the CloseWL control signal is asserted and the active wordline is automatically closed. The function of the control logic 16 in the current embodiment is consistent with the "asynchronous SRAM like" PSRAM interface as follows:

a) If the command detected by the address transition detector 51 is a read command, the read data is latched at an output buffer and the active wordline may be closed at any time thereafter.

b) If the command detected by the address transition detector 51 is an asynchronous write command, a write enable (/we) low signal and write data signal are asserted asynchronously sometime later. By setting a datasheet write cycle time equal to the length of the internal time delay (e.g., <10 μS), the datasheet can guarantee that a write operation cannot exceed the length of the internal time delay (e.g., 10 μS. In this manner, the datasheet guarantees that a write command will never be interrupted by the CloseWL control signal. Imposing a maximum write cycle time of 10 μS is not a burden because a typical a write command is completed at minimum cycle time 60 nS-70 nS in most systems.

Figure 6:
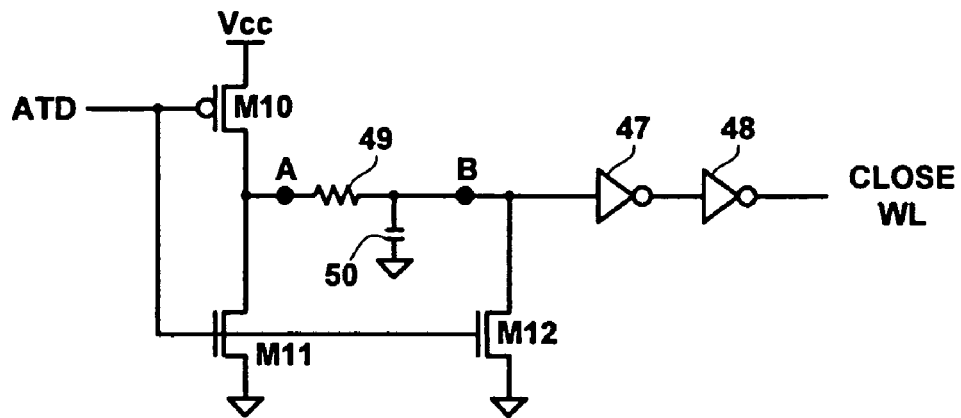
FIG. 6 is a schematic of the timeout generator circuit of FIG. 5 according to one embodiment.
Figure 7:
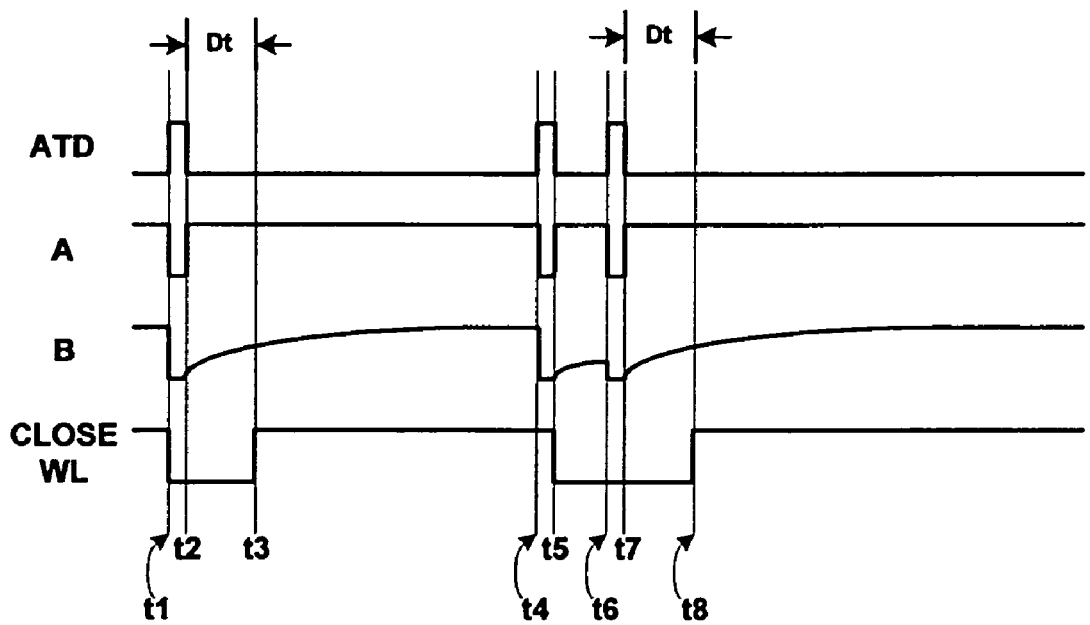
FIG. 7 illustrates a timing diagram of the timeout generator circuit of FIG. 6 according to one embodiment.

FIGS. 6 and 7 are a schematic diagram of, and a timing diagram for, the timeout generator circuit 46 of FIG. 5 according to one embodiment. Timeout generator circuit 46 includes a time delay portion and a reset portion.

In the embodiment illustrated in FIG. 6, the time delay portion includes a pMOS transistor M10, a resistor 49, a capacitor 50, and inverters 47 and 48. The drain of transistor M10 is connected to a voltage source (e.g., Vcc) and the source of transistor M10 is connected to one end of the resistor 49 at node A. Transistor M10 is gated by the output of the address transition detector circuit 51 (i.e., by the pulse ATD). The other end of the resistor 49 is connected in parallel to both the capacitor 50 and the input of inverter 47 at Node B. The other end of the capacitor 50 is connected to ground (GND). Inverters 47 and 48 are cascaded, such that the output of inverter 47 is provided to the input of inverter 48. The output of inverter 48 is connected to a wordline driver 35 and carries the control signal CloseWL.

Additionally, the reset portion includes nMOS transistors M11 and M12. The source and drain of transistor M11 are connected to the source of pMOS transistor M10 (at Node A) and to ground, respectively. The source and drain of transistor M12 are connected to Node B and to ground, respectively. Both transistors M11 and M12 are gated by the output of the address transition detector circuit 51 (i.e., by the pulse ATD). It should be apparent to one skilled in the art that other components, circuits, and/or configurations may be used while remaining within the scope of the present invention.

In operation, timeout generator circuit 46 receives the ATD pulse which is generated by the address transition detector 51 every time that an active mode signal is asserted (indicating, for example, a read or write operation). When ATD goes low, pMOS transistor M10 is activated, nMOS transistors M11 and M12 are deactivated. Node A is pulled quickly to Vcc while node B follows node A with a time delay set by the RC network formed by resistor 49 and capacitor 50. The CloseWL signal goes high after node B reaches a voltage level sufficient to overcome the threshold voltage of inverters 47 and 48.

When ATD goes high, pMOS transistor M10 is deactivated, nMOS transistors M11 and M12 are activated, nodes A and B are quickly pulled to ground, and the CloseWL signal is immediately forced low. Transistors M11 and M12, in effect, provide a "quick reset" mechanism to reset the RC delay should a new ATD pulse be asserted before the predetermined time interval expires.

Referring now to FIG. 7, the output of the address transition detector 51, which is normally low, goes high for a few nanoseconds each time an active mode signal is detected. At t1 (i.e., on the rising edge of the ATD pulse), nodes A and B and CloseWL each go low. At t2 (i.e., on the falling edge of the ATD pulse), node A is pulled quickly to Vcc while node B follows node A with a time delay set by the RC network formed by resistor 49 and capacitor 50. At t3, after a delay $D_t$ (e.g., 10 μS), node B has reached a voltage sufficient to overcome the threshold voltages of inverters 47 and 48 and CloseWL goes high (thus deactivating the associated wordline). It should be apparent to one skilled in the art that the amount of delay $D_t$ can easily be adjusted by changing the RC time constant provided by resistor 49 and capacitor 50. Additionally, it should be apparent to one skilled in the art that other components may be used to provide the desired amount of delay.

Continuing at t4, another active mode signal is detected and an ATD pulse is generated; nodes A and B and CloseWL each go low. At t5, node A is pulled quickly to Vcc while node B follows node A with a time delay set by the RC network formed by resistor 49 and capacitor 50. However before the delay $D_t$ has elapsed and the CloseWL signal is forced high, another active mode signal is detected and another ATD pulse is generated at t6. Nodes A and B go low while CloseWL remains low. At t7, node A is again pulled quickly to Vcc while node B follows node A with a time delay set by the RC network formed by resistor 49 and capacitor 50. At t8, node B has reached a voltage sufficient to overcome the threshold voltages of inverters 47 and 48 and CloseWL goes high (thus deactivating the associated wordline). In effect, the RC delay is reset at t6 and CloseWL does not go high until t8 (i.e., after $D_t$ from t7).

Figure 8:
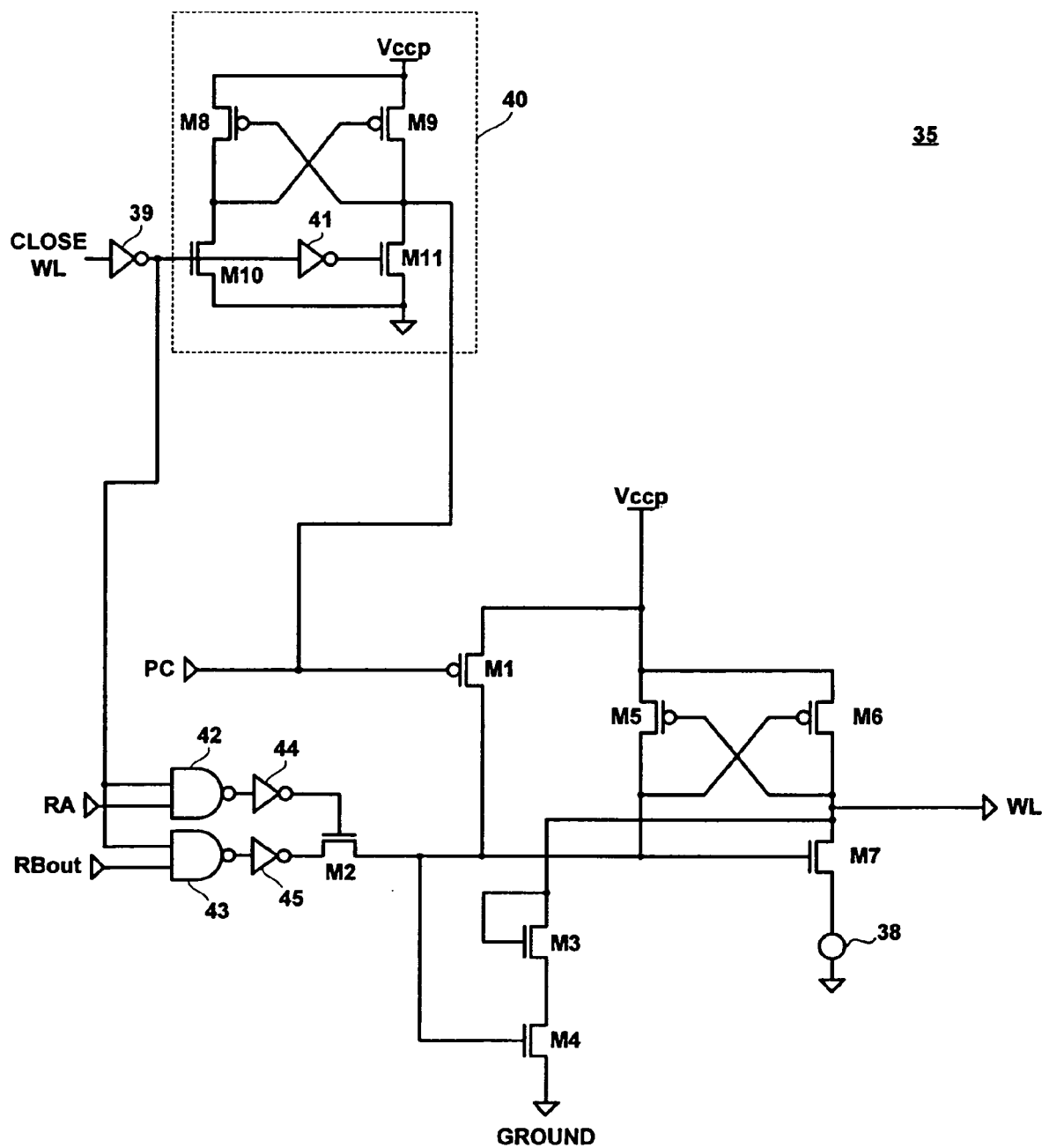
FIG. 8 is a circuit schematic for the wordline driver of FIG. 5 according to one embodiment.

FIG. 8 is a circuit schematic for the wordline driver 35 of FIG. 5 according to one embodiment. Generally when the wordline driver is in the active mode, M6 is conductive, M7 is nonconductive, and the wordline WL is driven to Vccp. In contrast, when the wordline driver is in the standby mode, M7 is conductive, M6 is nonconductive, and the wordline WL is driven to NEGWL (or some other potential such as 0V) by negative wordline voltage generator 38.

As discussed above, the activated wordline in a prior art devices typically remains activated until a signal to activate another wordline (e.g., WL1, WL2, WL3, etc.) is received or until the array 30 enters into standby mode. In contrast, the wordline driver 35 of the current embodiment is responsive to the CloseWL control signal (in addition to the precharge (PC) signal and the address signals (RA and RBout)).

As illustrated in FIG. 8, the CloseWL control signal is applied to the input of inverter 39. The output of inverter 39 is supplied to level translator circuit 40, which "level translates" the low voltage swing levels of the inverter CloseWL control signal at the level translator circuit's 40 input (i.e., 0V→Vcc) to high voltage levels at the level translator circuit's 40 output (i.e., 0V→Vccp), and to an input of NAND gate 42 and an input of NAND gate 43. The output of the level translator circuit 40 is applied to the precharge (PC) signal line. A second input of NAND gate 42 receives the signal RA, whereas the second input of NAND gate 43 receives the signal RBout. The output of NAND gate 42 is inverted by inverter 44 and applied to the gate of transistor M2. The output of NAND gate 43 is inverted and applied to the source of transistor M2. Accordingly when applied, the CloseWL control signal deactivates the wordline driver 35 by driving the wordline WL to the negative wordline voltage (NEGWL).

Figure 9:
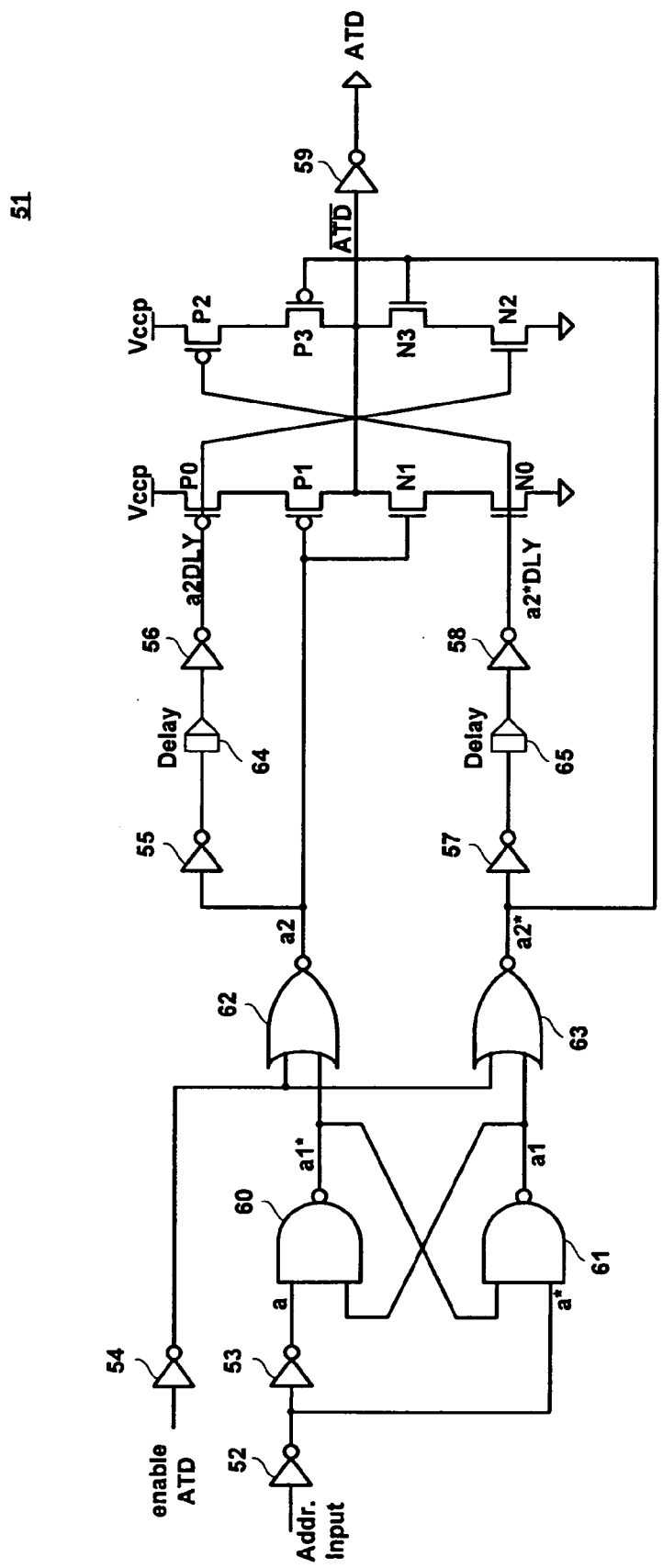
FIG. 9 is a schematic of the address transition detector circuit of FIG. 5 according to one embodiment.

FIG. 9 is a schematic of the address transition detector circuit 51 of FIG. 5 according to one embodiment. Inverter 52 receives an address input signal and generates signal "a*" which is fed to the input of inverter 53 and NAND gate 61. Inverter 53 generates signal "a" (i.e., the complement of a*), which is fed to the input of NAND gate 60. NAND gate 60 and NAND gate 61 generate signals a1* and a1, respectively. The output of NAND gate 60 (i.e., a1*) is fed to an input of NAND gate 61 and an input of NOR gate 62, whereas the output of NAND gate 61 (i.e., a1) is fed to an input of NAND gate 60 and an input of NOR gate 63. The enable ATD signal is inverted by inverter 54 and fed to the inputs of NOR gate 62 and NOR gate 63, which generate complimentary signals a2 and a2*, respectively.

Signal a2 is inverted by inverter 55, fed to delay circuit 64, and inverted by inverter 56 to generate signal a2DLY. Transistors P0 and N0 are gated with signal a2DLY, whereas transistors P1 and N1 are gated by signal a2. Similarly, signal a2* is inverted by inverter 57, fed to delay circuit 65, and inverted by inverter 58 to generate signal a2*DLY. Transistors N0 and P2 are gated with signal a2*DLY, whereas transistors P3 and N3 are gated by signal a2*.

Figure 10:
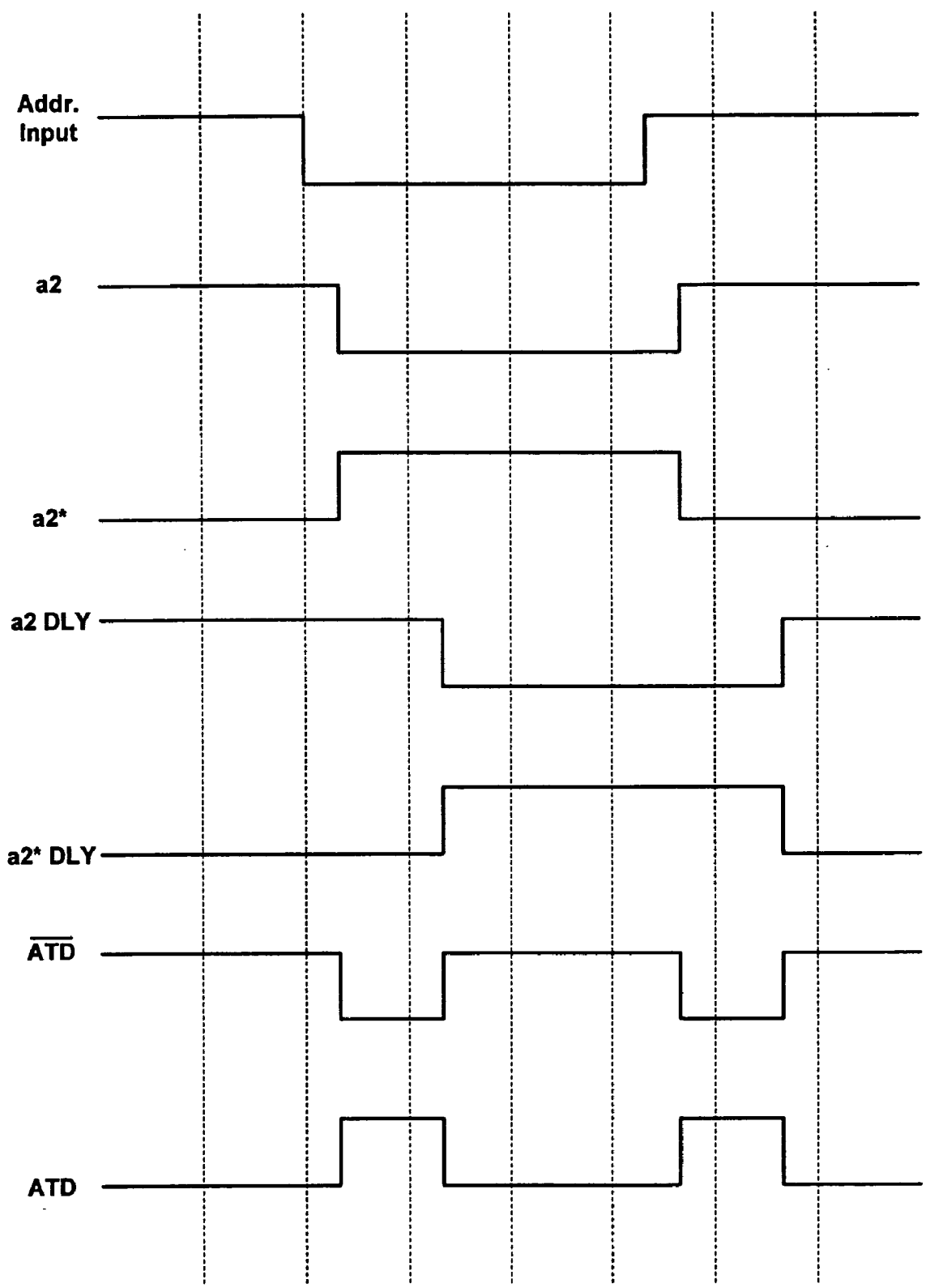
FIG. 10 illustrates a timing diagram of the address transition detector circuit of FIG. 9 according to one embodiment.

FIG. 10 illustrates several waveforms for the address transition detection circuit 51 shown in FIG. 9 according to one embodiment. It should be apparent to one skilled in the art that the signals a2, a2*, a2DLY, and a2*DLY are generated in response to the address input signal. Furthermore, it should be apparent to one skilled in the art that the n-channel stacks N0-N1 or N2-N3 will conduct in response to a2, a2*, a2DLY, and a2*DLY as illustrated in the waveforms of FIG. 10. Specifically, a short ATD pulse is generated in response to either a rising or falling edge on the address input signal. Furthermore, it should be apparent to one skilled in the art that the width of the ATD pulse output by address transition detector circuit 51 depends upon the delay caused by the delay circuits 64, 65. In the current embodiment, the delay caused by the delay circuits 64, 65 is approximately 1-3 ns. Thus the width of the ATD pulse output by the address transition detector circuit 51 is approximately 1-3 ns.

It should be recognized that the above-described embodiments of the invention are intended to be illustrative only. Numerous alternative embodiments may be devised by those skilled in the art without departing from the scope of the following claims.

What is claimed is:

1. A timeout generator circuit, comprising:
a time delay portion responsive to an edge of a control pulse for connecting a first node to a first voltage, a second node within said time delay portion being connected to said first node so as to begin charging when said first node is connected to said first voltage, said time delay portion producing a close signal after said second node has charged to a predetermined percentage of said first voltage; and
a reset portion responsive to another edge of said control pulse for selectively connecting said first node to ground through a first path and said second node to ground through a second path so as to pull both nodes to ground to reset said time delay portion.

2. The timeout generator circuit of claim 1 wherein said first node and said second node are connected through a resistive element and a capacitive element such that said charging of said second node is a function of an RC time constant.

3. The timeout generator circuit of claim 1 wherein said time delay portion is configured to connect said first node to said first voltage after receiving a falling edge of said control pulse.

4. The timeout generator circuit of claim 3 wherein said reset portion is configured to connect said first node to ground through said first circuit path after receiving a rising edge of said control pulse.

5. Control logic for a memory device, comprising:
an address transition detector for producing a control pulse; and
a timeout generator circuit comprising:
a time delay portion responsive to an edge of a control pulse for connecting a first node to a first voltage, a second node within said time delay portion being connected to said first node so as to begin charging when said first node is connected to said first voltage, said time delay portion producing a close signal for closing an active wordline in a memory device after said second node has charged to a predetermined percentage of said first voltage; and
a reset portion responsive to another edge of said control pulse for selectively connecting said first node to ground through a first path and said second node to ground through a second path so as to pull both nodes to ground to reset said time delay portion.

6. The control logic of claim 5 wherein said address transition detector is configured to produce said control pulse when an active mode signal is asserted for said memory device.

7. The control logic of claim 5 wherein said first node and said second node are connected through a resistive element and a capacitive element such that said charging of said second node is a function of an RC time constant.

8. The control logic of claim 5 wherein said time delay portion is configured to connect said first node to said first voltage after receiving a falling edge of said control pulse.

9. The control logic of claim 8 wherein said reset portion is configured to connect said first node to ground through said first circuit path after receiving a rising edge of said control pulse.

10. A memory device, comprising:
a memory array having a plurality of memory cells, a plurality of wordlines and a plurality of digitlines, wherein said memory cells are accessible by said wordlines and said digitlines;
a wordline driver for activating at least one of said wordlines, said wordline driver responsive to a close signal; and
control logic, comprising:
an address transition detector for producing a control pulse having first and second edges; and a timeout generator circuit comprising:
  a time delay portion responsive to an edge of a control pulse for connecting a first node to a first voltage, a second node within said time delay portion being connected to said first node so as to begin charging when said first node is connected to said first voltage, said time delay portion producing a close signal for closing an active wordline in the memory device after said second node has charged to a predetermined percentage of said first voltage; and
  a reset portion responsive to another edge of said control pulse for selectively connecting said first node to ground through a first path and said second node to ground through a second path so as to pull both nodes to ground to reset said time delay portion.

11. The memory device of claim 10 wherein said wordline driver automatically deactivates said at least one of said wordlines in response to said close signal.

12. The memory device of claim 10 wherein said address transition detector is configured to produce said control pulse when an active mode signal is asserted for said memory device.

13. The memory device of claim 10 wherein said first node and said second node are connected through a resistive element and a capacitive element such that said charging of said second node is a function of an RC time constant.

14. The memory device of claim 10 wherein said time delay portion is configured to connect said first node to said first voltage after receiving a falling edge of said control pulse.

15. The memory device of claim 14 wherein said reset portion is configured to connect said first node to ground through said first path after receiving a rising edge of said control pulse.

16. A system, comprising:
  a processor;
  a memory device connected to said processor through a bus, said memory device comprising:
  a memory array having a plurality of memory cells, a plurality of wordlines and a plurality of digitlines, wherein said memory cells are accessible by said wordlines and said digitlines;
  a wordline driver for activating at least one of said wordlines, said wordline driver responsive to a close signal; and
  control logic, comprising:
    an address transition detector for producing a control pulse having first and second edges; and
    a timeout generator circuit comprising:
      a time delay portion responsive to an edge of a control pulse for connecting a first node to a first voltage, a second node within said time delay portion being connected to said first node so as to begin charging when said first node is connected to said first voltage, said time delay portion producing a close signal for closing an active wordline in said memory device after said second node has charged to a predetermined percentage of said first voltage; and
      a reset portion responsive to another edge of said control pulse for selectively connecting said first node to ground through a first path and said second node to ground through a second path so as to pull both nodes to ground to reset said time delay portion.

17. A method for producing a signal for closing an active wordline in a memory array, comprising:
  generating a control pulse having first and second edges in response to an active mode signal;
  connecting a first node to a first voltage in response to said first edge of said control pulse;
  charging a second node connected to said first node according to a time delay;
  producing a close signal for closing an active wordline in a memory device after said second node has charged to a predetermined percentage of said first voltage; and
  selectively connecting said first node to ground through a first path and said second node to ground through a second path in response to said second edge of said control pulse so as to pull both nodes to ground to reset said time delay portion.

18. The method of claim 17 wherein said generating a control pulse includes at least one of:
  detecting a rising edge of said active mode signal; and
  detecting a falling edge of said active mode signal.

19. The method of claim 17 wherein said producing a close signal further comprises setting a predetermined time delay interval for said second node to charge to said predetermined percentage of said first voltage so as to prevent said close signal from being produced while at least one of a write command and a read command is enabled.

20. A method for producing a signal for closing an active wordline in a memory array, comprising:
  generating a control pulse having first and second edges in response to an active mode signal;
  connecting a first node to a first voltage in response to said first edge of said control pulse;
  charging a second node connected to said first node according to a time delay;
  producing a close signal for closing an active wordline in a memory device after said second node has charged to a predetermined percentage of said first voltage;
  connecting said first node to ground in response to said second edge of said control pulse so as to reset said time delay portion; and
  wherein said producing a close signal further comprises setting a predetermined time delay interval for said second node to charge to said predetermined percentage of said first voltage so as to prevent said close signal from being produced while at least one of a write command and a read command is enabled.

* * * * *